United States Patent
Shiota et al.

(10) Patent No.: US 7,122,082 B2
(45) Date of Patent: Oct. 17, 2006

(54) SILICON WAFER AND MANUFACTURING METHOD THEREOF

(75) Inventors: Takaaki Shiota, Noda (JP); Yoshinobu Nakada, Ageo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/706,266

(22) Filed: Nov. 13, 2003

(65) Prior Publication Data

US 2004/0207048 A1    Oct. 21, 2004

(30) Foreign Application Priority Data

Nov. 20, 2002    (JP)    ............................ P2002-336690

(51) Int. Cl.
*C30B 15/14*    (2006.01)
(52) U.S. Cl. .............................. 117/13; 117/14; 117/15; 117/17; 117/18; 117/20; 117/932; 423/344
(58) Field of Classification Search .................. 117/13, 117/14, 15, 17, 18, 20, 932; 423/344
See application file for complete search history.

(56) References Cited

U.S. PATENT DOCUMENTS

| | | | |
|---|---|---|---|
| 6,174,364 B1 * | 1/2001 | Yamanaka et al. ............ 117/20 |
| 6,409,827 B1 * | 6/2002 | Falster et al. .................. 117/15 |
| 6,521,316 B1 * | 2/2003 | Lee et al. .................... 428/64.1 |
| 6,562,123 B1 * | 5/2003 | Falster et al. .................. 117/13 |
| 6,632,278 B1 * | 10/2003 | Falster et al. .................. 117/84 |
| 6,849,901 B1 * | 2/2005 | Falster ........................ 257/347 |
| 6,858,307 B1 * | 2/2005 | Vornokov et al. ........... 428/446 |
| 2002/0100410 A1 * | 8/2002 | Kim et al. ..................... 117/13 |
| 2003/0106484 A1 * | 6/2003 | Fusegawa et al. ............ 117/19 |

FOREIGN PATENT DOCUMENTS

| JP | 2001-156074 | 6/2001 |
|---|---|---|
| WO | WO 98/38675 A1 | 9/1998 |

* cited by examiner

*Primary Examiner*—Robert Kunemund
(74) *Attorney, Agent, or Firm*—Pillsbury Winthrop Shaw Pittman LLP (57) ABSTRACT

A silicon wafer wherein stacking fault (SF) nuclei are distributed throughout the entire in-plane direction, and the density of the stacking fault nuclei is set to a range of between $0.5 \times 10^8$ cm$^{-3}$ and $1 \times 10^{11}$ cm$^{-3}$.

11 Claims, 4 Drawing Sheets

SILICON WAFER AND MANUFACTURING METHOD THEREOF

BACKGROUND OF THE INVENTION

1. Field of the Invention

The present invention is related to silicon wafers and their manufacturing method, in particular, to technology suited to the manufacture of silicon wafers having a superior intrinsic gettering (IG) effect. Priority is claimed on Japanese Patent Application No. 2002-336690, the content of which is incorporated herein by reference.

2. Description of Related Art

Silicon wafers manufactured by processing a silicon single-crystal grown by pulling with the Czochralski (CZ) method contain many oxygen impurities. These oxygen impurities form oxygen deposits (referred to as Bulk Micro Defects: BMD) which give rise to dislocation and defects and the like. When these oxygen deposits are on the surface on which devices are formed, they cause increased leakage current and reduced oxide film withstand voltage and the like, having significant effects on the characteristics of the semiconductor device.

Conventionally, therefore a method as hereunder, wherein a DZ layer (Denuded Zone, i.e. a defect-free layer) is formed uniformly has been employed (see pamphlet International Unexamined Patent Application No. 98/38675). That is, the surface of the silicon wafer is rapidly heated to a temperature of 1250° C. or higher and quenched (Rapid Thermal Annealing: RTA) over a short period of time, in a prescribed atmosphere gas to form a high concentration of atomic vacancies (hereafter referred to as 'vacancies') within the interior of the silicon wafer. Furthermore, quenching the silicon wafer freezes the atomic vacancies. It is then heat treated at, for example, a temperature of 800° C. for four hours, after which it is then immediately heated to 1000° C. for 16 hours, to disperse the vacancies on the surface of the wafer to the exterior.

Moreover, conducting heat treatment at a temperature below the aforementioned temperature following formation of the DZ layer, forms and stabilizes oxygen deposits in the interior of the silicon wafer, forming a defect layer, and thus a process wherein a BMD layer having a gettering effect is formed is also adopted. Furthermore, other published documents include, for example, Japanese Unexamined Patent Application First Publication No. 2001-156074.

However, the following problems relating to the aforementioned heat treatment technology remain unresolved.

That is, a strong requirement exists for silicon wafers with a higher gettering capacity. However, raising the gettering capacity presents difficulties due to an increase in BMD size to between 50 nm and 200 nm.

SUMMARY OF THE INVENTION

The present invention takes into consideration the above situation, with an object of providing a silicon wafer having a higher gettering effect, and a manufacturing method thereof.

In the silicon wafer of the present invention, the aforementioned problems are resolved by distributing stacking fault nuclei throughout the entire in-plane direction, and setting the density of the stacking fault nuclei to a range of between $0.5 \times 10^8$ cm$^{-3}$ and $5 \times 10^{11}$ cm$^{-3}$.

The silicon wafer of the present invention may adopt one where the silicon wafer is cut from an ingot formed from a perfect region wherein interstitial silicon-type point defect agglomerates and vacancy-type point defect agglomerates are practically non-existent.

The silicon wafer of the present invention may also adopt one where the silicon wafer is cut from an ingot formed from a region wherein vacancy-type point defects are dominant.

The manufacturing method of a silicon wafer of the present invention is a method wherein an ingot pulled from a silicon melt in a crucible in accordance with the Czochralski method is sliced to manufacture the silicon wafer, and adopts;

a step of pulling the ingot such that a ratio V/G of, a rate V at which the ingot is pulled, and a temperature gradient G of the ingot in the vertical direction in the vicinity of an interface between the silicon melt in the crucible and the ingot, is between 0.20 mm$^2$/° C.·minute and 0.25 mm$^2$/° C.·minute, or a step of adding nitrogen while pulling the ingot, to thereby set an internal nitrogen concentration within a range of between $5 \times 10^{14}$ cm$^{-3}$ and $1 \times 10^{15}$ cm$^{-3}$.

The manufacturing method of a silicon wafer of the present invention is a manufacturing method of the aforementioned silicon wafer, and includes;

a vacancy heat treatment step for forming new vacancies in the interior of the silicon wafer by means of a heat treatment of the silicon wafer in an atmosphere gas containing nitrogen, and an SF nuclei heat treatment step which uses the vacancies formed in the vacancy heat treatment step to form stacking fault nuclei from agglomeration of interstitial silicon released during precipitation of oxygen, and a temperature in the SF nuclei heat treatment step may be above 1100° C., and increased at a rate of not more than 10° C./minute.

In the abovementioned manufacturing method of a silicon wafer, the oxide film on the surface of the silicon wafer may be previously removed, prior to the vacancy heat treatment step.

In the abovementioned manufacturing method of a silicon wafer, during the vacancy heat treatment step, purging may be conducted to remove oxygen from the atmosphere gas surrounding the silicon wafer, and the silicon wafer may be quenched after the vacancy heat treatment step.

In the abovementioned manufacturing method of a silicon wafer of the present invention, or manufacturing method of any of the aforementioned silicon wafer, heat treatment of the silicon wafer may be employed to form at least a defect-free layer on the surface of the silicon wafer.

The silicon wafer of the present invention is manufactured by the abovementioned manufacturing methods of a silicon wafer, and thus resolves the above problems.

In the present invention, stacking faults (SF) which exerts an IG effect, or SF nuclei forming SFs, can be formed in the device manufacturing process using heat treatment and the like. Distribution of these SF nuclei throughout the entire in-plane direction of the silicon wafer enables the provision of silicon wafers wherein it is possible to form large SFs of a maximum diameter of 5 μm, in comparison to BMDs of between 100 nm and 200 nm, using heat treatment in the device manufacturing process. Thus, in comparison with BMDs, it is possible to obtain a high IG effect over the entire surface of the silicon wafer.

At this time, it is desirable to set the SF nuclei density to between $0.5 \times 10^8$ cm$^{-3}$ and $1.0 \times 10^{11}$ cm$^{-3}$. Setting the SF nuclei density to less than $0.5 \times 10^8$ cm$^{-3}$ inhibits obtaining the desired IG effect, and is therefore undesirable. Moreover, setting the SF nuclei density to more than $1.0\times10^{11}$ cm$^{-3}$ inhibits development of sufficient mechanical strength of the silicon wafer, and is therefore undesirable.

Furthermore, in the present invention, the silicon ingot is pulled such that the ratio V/G of, the rate at which the ingot is pulled V and the temperature gradient of the ingot G, is maintained within a range of between 0.20 mm$^2$/° C.·minute and 0.25 mm$^2$/° C.·minute, and silicon wafers are cut from this ingot. In this case, in addition to setting the SF nuclei density to between $0.5\times10^8$ cm$^{-3}$ and $1.0\times10^{11}$ cm$^{-3}$, the SF nuclei are such that they can be distributed throughout the entire in-plane direction of the silicon wafer. Thus, in comparison with BMDs, it is possible to provide a silicon wafer with a high IG effect over the entire surface of the silicon wafer.

Moreover, in the present invention, nitrogen is added (doping) while pulling, and silicon wafers are cut from ingots having an internal nitrogen concentration of between $5\times10^{14}$ cm$^{-3}$ and $5\times10^{15}$ cm$^{-3}$. In this case, in addition to setting the SF nuclei density to between $0.5\times10^8$ cm$^{-3}$ and $1.0\times10^{11}$ cm$^{-3}$ as noted above, the SF nuclei can be distributed throughout the entire in-plane direction of the silicon wafer. In comparison with BMDs, therefore, it is possible to provide a silicon wafer with a high IG effect over the entire surface of the silicon wafer.

Furthermore, the present invention includes; a vacancy heat treatment process wherein new vacancies are formed in the interior of the silicon wafer by means of heat treatment of the silicon wafer in an atmosphere gas containing $N_2$ or $NH_3$ and the like, and an SF nuclei heat treatment process wherein SF nuclei are formed. In this case, in addition to setting the SF nuclei density to between $0.5\times10^8$ cm$^{-3}$ and $1.0\times10^{11}$ cm$^{-3}$ as noted above, the SF nuclei can be distributed throughout the entire in-plane direction of the silicon wafer. In comparison with BMDs, therefore, it is possible to provide a silicon wafer with a high IG effect over the entire surface of the silicon wafer.

In the abovementioned vacancy heat treatment process, for example either $NH_3$ may be used as an atmosphere gas containing nitrogen, together with a heat treatment temperature of between 1135° C. and 1170° C., or $N_2$ may be used as an atmosphere gas containing nitrogen, together with a heat treatment temperature of above 1250° C. Under these conditions, a heat treatment process including rapid heating and quenching (RTA) over a short period of time is conducted to form a high concentration of vacancies within the interior. Moreover, after freezing the highly concentrated vacancies by quenching, heat treatment wherein the temperature is above 1100° C. and the rate of temperature increase is set to under 10° C./minute, can be conducted as the aforementioned SF nuclei heat treatment process.

In this case, if the temperature of the SF nuclei heat treatment process is set to below 1100° C., interstitial silicon released when oxygen is precipitated using the supersaturated vacancies is insufficient, and therefore cannot be agglomerated to form SF nuclei, and is therefore undesirable. Furthermore, if the rate of temperature increase is set to more than 10° C./minute, sufficient oxygen cannot be precipitated using the supersaturated vacancies. As a result, the interstitial silicon released when oxygen is precipitated can no longer agglomerate to form SF nuclei, and is therefore undesirable.

Moreover, heat treatment of the silicon wafer can be employed to form at least a defect-free layer on the surface. In this case, silicon wafers having excellent semiconductor device characteristics without leakage and the like in the device formation region can be obtained.

Manufacture of the silicon wafer of the present invention with the abovementioned manufacturing method can provide a silicon wafer having excellent semiconductor device characteristics without leakage and the like in the device formation region.

According to the silicon wafer and manufacturing method of the present invention, SF nuclei density is set to between $0.5\times10^8$ cm$^{-3}$ and $5\times10^{11}$ cm$^{-3}$, and SF nuclei are distributed throughout the entire in-plane direction, and thus, in comparison with BMDs, it is possible to obtain a high IG effect over the entire surface of the silicon wafer.

BRIEF DESCRIPTION OF THE DRAWINGS

FIG. 3A and FIG. 3B are sectional views illustrating the silicon wafer of the first embodiment of the silicon wafer and manufacturing method of the present invention. In other words, FIG. 3A illustrates a condition after vacancy heat treatment for formation of vacancies, and FIG. 3B illustrates a condition after further heat treatment.

FIG. 4A and FIG. 4B are plan views illustrating the silicon wafer. In other words, FIG. 4A illustrates a condition wherein an OSF ring has appeared, and FIG. 4B illustrates the present invention wherein the entire surface is an SF nuclei region.

FIG. 5A and FIG. 5B are sectional views of the silicon wafer showing a gettering effect. FIG. 5A illustrates a case of BMDs alone, and FIG. 5B illustrates a case after formation of SF of the present invention.

DETAILED DESCRIPTION OF THE INVENTION

[First Embodiment]

A first embodiment of a silicon wafer and manufacturing method related to the present invention is explained below with reference to the drawings.

Figure 1:
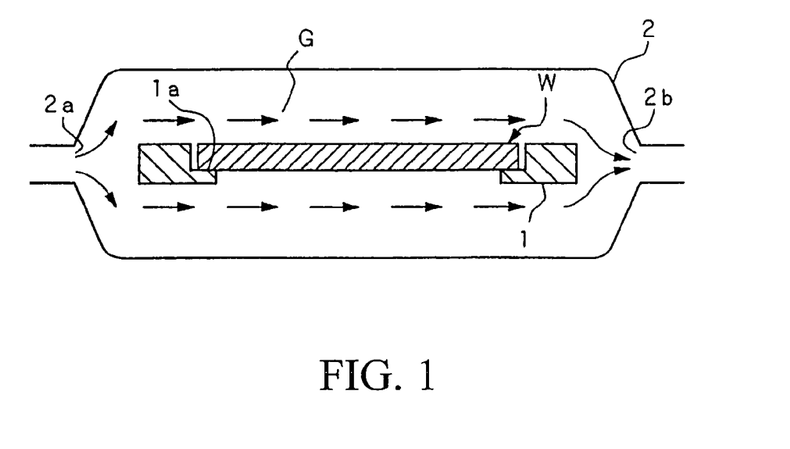
FIG. 1 is a sectional view illustrating in outline the overall configuration of a heat treatment furnace employed in a first embodiment of a silicon wafer and manufacturing method of the present invention.
Figure 2:
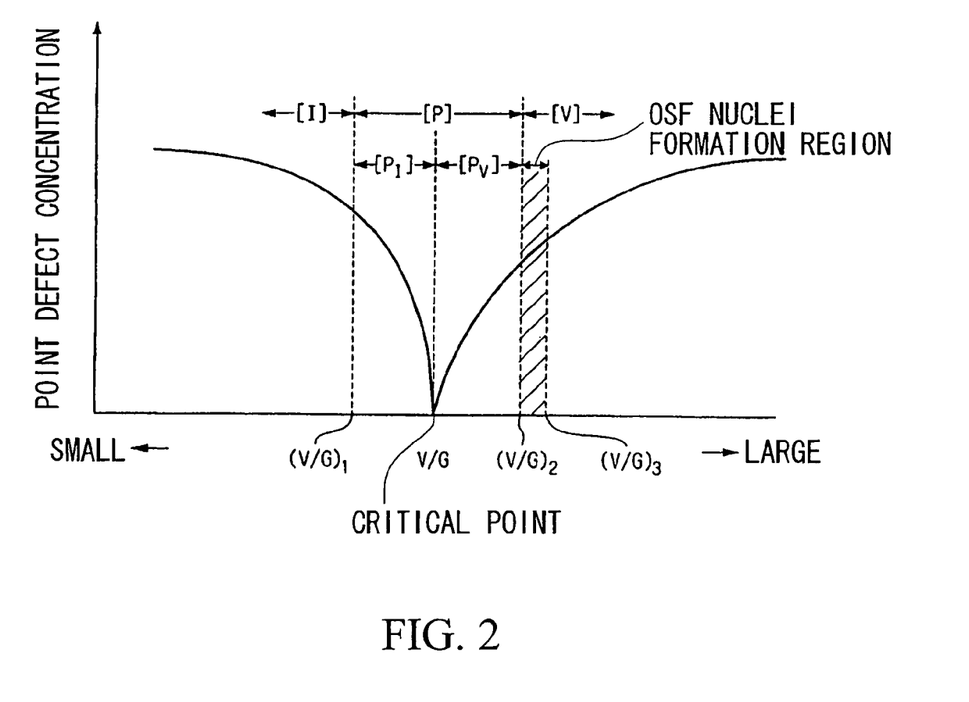
FIG. 2 is a graph illustrating, based on Voronkov's theory, the formation of an ingot with abundant vacancies at a V/G ratio above the critical point, and the formation of an ingot with abundant interstitial silicon at a V/G ratio below the critical point.
Figure 3A:
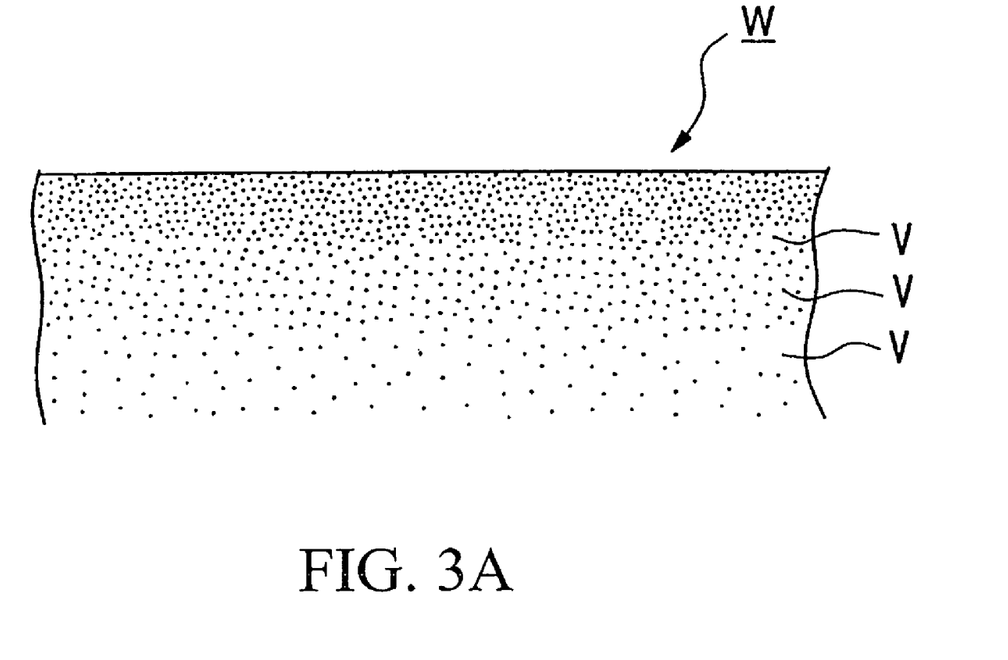
Figure 3B:
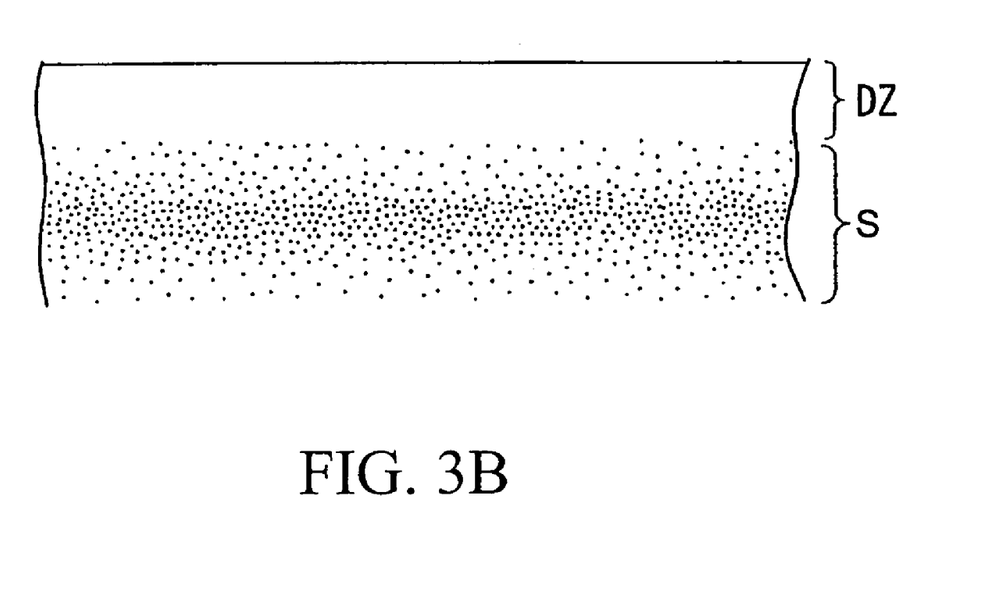
Figure 4A:
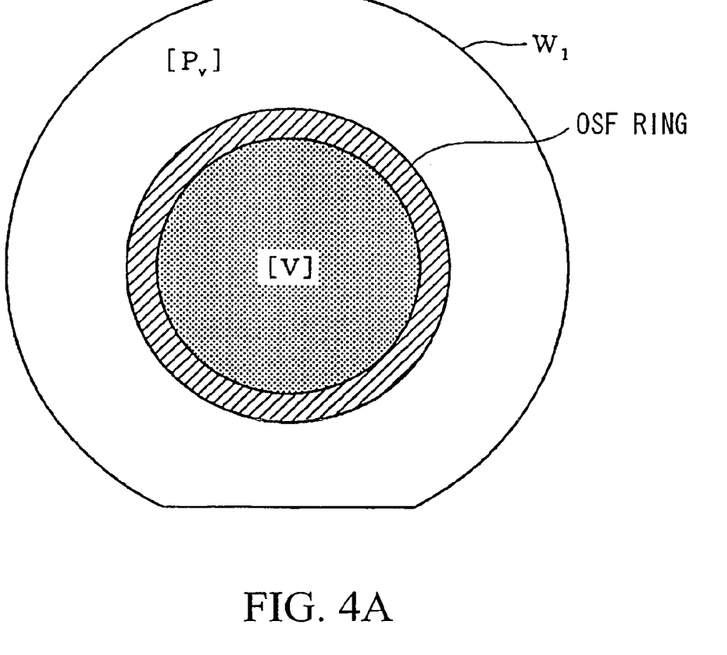
Figure 4B:
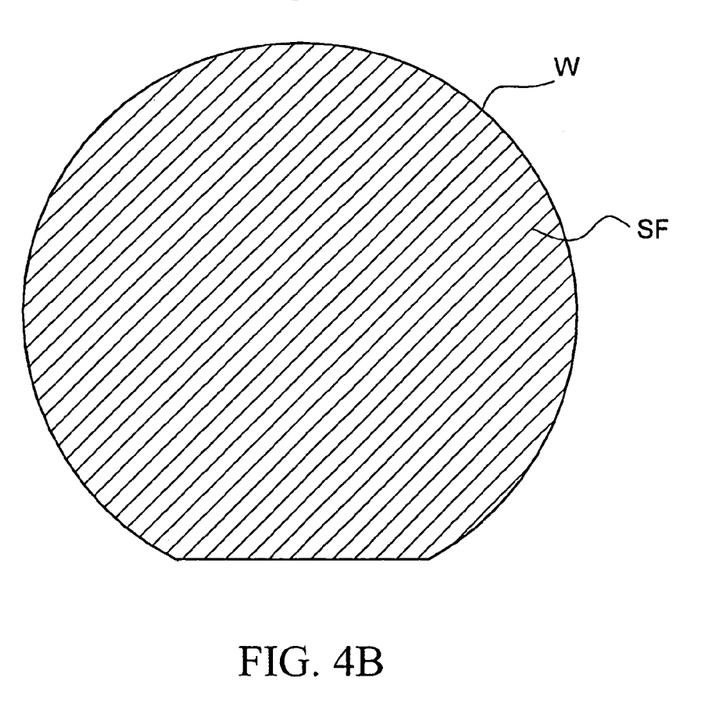
Figure 5A:
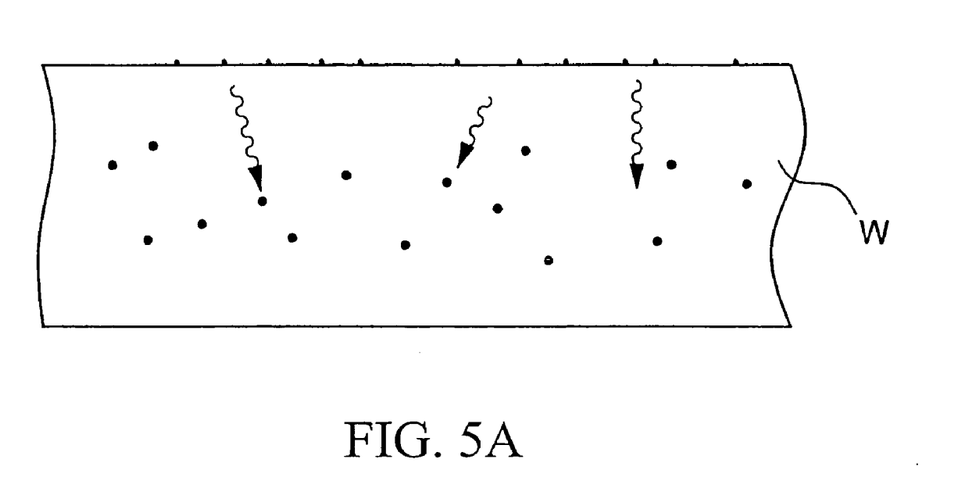
Figure 5B:
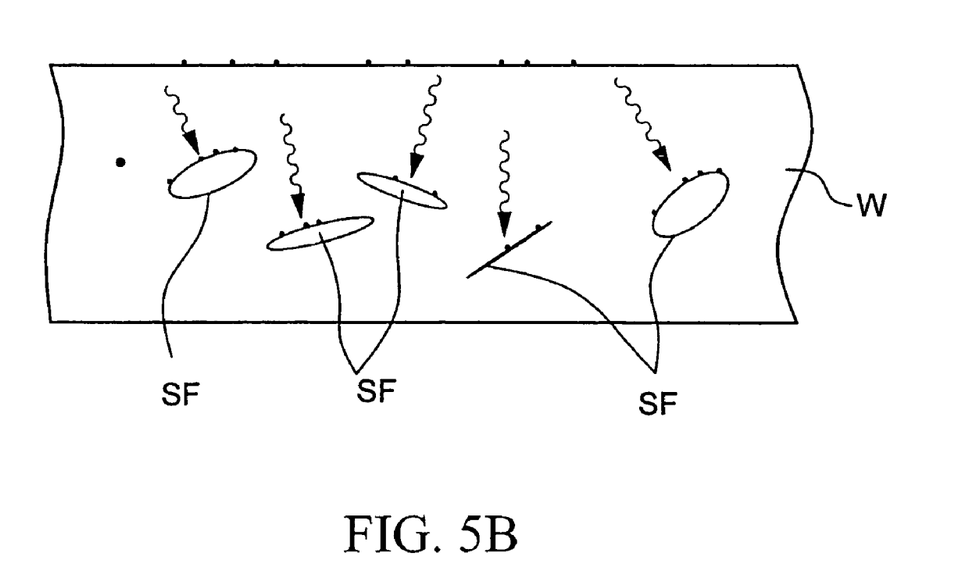

FIG. 1 illustrates a single wafer heat treatment furnace employed in implementing the manufacturing method of silicon wafers of the present embodiment. FIG. 2 is a graph illustrating, based on Voronkov's theory, the formation of an ingot with abundant vacancies at a V/G ratio above the critical point, and the formation of an ingot with abundant interstitial silicon at a V/G ratio below the critical point. FIG. 3A and FIG. 3B are sectional views illustrating the silicon wafer of the present embodiment. FIG. 3A illustrates a condition after vacancy heat treatment for formation of vacancies, and FIG. 3B illustrates a condition after further heat treatment. FIG. 4A and FIG. 4B are plan views illustrating silicon wafers. FIG. 4A illustrates a condition wherein an OSF ring has appeared, and FIG. 4B illustrates the present invention wherein the entire surface is an SF nuclei region. FIG. 5A and FIG. 5B are sectional views of the silicon wafer illustrating a gettering effect. FIG. 5A illustrates a case of BMDs alone, and FIG. 5B illustrates a case after formation of SF of the present invention.

In the above drawings, reference symbol W denotes a silicon wafer, reference symbol 1 denotes a susceptor, and reference symbol 2 denotes a reaction chamber.

The heat treatment furnace shown in FIG. 1 is provided with the annular susceptor 1 capable of mounting the silicon wafer W, and the reaction chamber 2 capable of housing the susceptor 1. A lamp (not shown in the drawing) is provided on the exterior of the reaction chamber 2 to heat the silicon wafer W.

The susceptor 1 is formed from silicon carbide or the like. A step 1*a* is provided on the inside of the susceptor 1, and the edge of the silicon wafer W is mounted on the step 1*a*.

The reaction chamber 2 is provided with a supply port 2*a* to supply an atmosphere gas G to the surface of the silicon wafer W, and a discharge port 2*b* through which the atmosphere gas G is discharged.

Furthermore, the supply port 2*a* is connected to the atmosphere gas G supply source (omitted from the drawing).

Moreover, the atmosphere gas G includes primarily $NH_3$.

Assuming that, within the silicon single-crystal ingot, a region wherein interstitial silicon-type point defects are dominant is referred to as [I], a region wherein vacancy-type point defects are dominant is referred to as [V], and a perfect region wherein interstitial silicon-type point defect agglomerates and vacancy-type point defect agglomerates are non-existent is referred to as [P], the silicon wafer W noted above is a silicon wafer cut from an ingot formed from the perfect region [P] wherein point defect agglomerates are non-existent. Furthermore, vacancy-type point defects are defects due to vacancies formed by desorption of a silicon atom from a normal silicon crystal lattice. Moreover, interstitial silicon point defects are defects wherein atoms are at positions other than lattice points of the silicon crystal (interstitial sites).

In other words, the silicon wafer formed from this perfect region [P] is, as proposed in, for example Japanese Unexamined Patent Application First Publication No. Hei 1-1393, manufactured by slicing an ingot pulled from the silicon melt within the hot zone using the Czochralski method, and with a pulling speed profile based on Voronkov's theory.

Assuming the rate at which the ingot is pulled as V (mm/minute), and the temperature gradient of the ingot in the vertical direction in the vicinity of the interface between the silicon melt in the crucible and the ingot as G (° C./minute), the ingot is manufactured with a value of V/G ($mm^2$/° C.·minute) such that ring-shaped OSFs (Oxidation-Induced Stacking Fault) occurring during thermal oxidation are dissipated at the center of the silicon wafer.

The relationship between V/G ratio and point defect concentration is shown graphically in FIG. 2. The V/G ratio is displayed on the horizontal axis, and vacancy-type point defect concentration and interstitial silicon-type defect concentration are displayed on the same vertical axis. Voronkov's theory noted above explains the determination of the boundary between the vacancy region and the interstitial silicon region by the V/G ratio on this basis. In greater detail, ingots wherein vacancy-type defect concentration is predominant are formed at a V/G ratio above the critical point. On the other hand, ingots wherein interstitial silicon-type defect concentration is predominant are formed at a V/G ratio above the critical point. In FIG. 2, the symbol [I] indicates that interstitial silicon-type point defects are dominant, and shows the region wherein interstitial silicon-type point defects exist (equal to or less than $(V/G)_1$). Moreover, the symbol [V] indicates that vacancy-type point defects are dominant within the ingot, and shows the region wherein vacancy-type point defect agglomerates exist (equal to or less than $(V/G)_2$). Furthermore, the symbol [P] indicates the perfect region wherein no vacancy-type point defect agglomerates or interstitial silicon-type point defect agglomerates exist ($(V/G)_1$ to $(V/G)_2$). A region [OSF] ($(V/G)_2$ to $(V/G)_3$) forming OSF nuclei exists in the region [V] adjacent to the region [P].

The pulling speed profile for the ingot provided for the silicon wafer is therefore determined such that when the ingot is pulled from the silicon melt in the hot zone, the ratio of pulling speed to temperature gradient (V/G) is maintained above the first critical point ratio ($(V/G)_1$) to prevent occurrence of interstitial silicon-type point defect agglomerates, and below the second critical point ratio ($(V/G)_2$) to restrict vacancy-type point defect agglomerates to within the region at the center of the ingot wherein vacancy-type point defects are dominant.

This pulling speed profile is determined by experiments wherein a standard ingot is sliced along its axis, or by performing simulations and on the basis of the aforementioned Voronkov's theory.

Values for sensitivity and the lower limit for detection of point defect agglomerates including COP (Crystal Originated Particles) and the like may differ with the detection method used. The meaning of 'point defect agglomerates are non-existent' in the present invention therefore indicates that, when the product of the observed area and the etching allowance is observed as the inspected area with an optical microscope after Secco etching without stirring of a silicon single-crystal polished to a mirror finish, the number of point defect agglomerates is less than the lower detection limit. The lower detection limit is defined as one defect per $1\times10^{-3}$ $cm^3$ of inspected area of each agglomerate of flow patterns (vacancy-type defects) and dislocation clusters (interstitial silicon-type point defects) ($1\times10^3/cm^3$).

The method wherein the silicon wafer W is subjected to RTA treatment (Rapid Thermal Annealing) in the atmosphere gas G using the heat treatment furnace noted above and forming new vacancies in the interior, and the method wherein a further DZ layer (Denuded Zone, i.e. a defect-free layer) is formed on the surface of the silicon wafer W and an SF layer formed in the interior, are explained below.

It is desirable initially to remove or reduce the thickness of the natural oxide film, and oxide films formed by other processing and the like, on the surface of the silicon wafer W, prior to RTA employed to inject vacancies. In other words, prior to heat treatment, the silicon wafer W is washed with hydrofluoric acid or the like to remove oxide films on the surface which inhibit nitriding of the surface.

In order to subject the silicon wafer W to RTA treatment (heat treatment involving rapid heating and quenching) as vacancy heat treatment using the aforementioned heat treatment furnace, the silicon wafer W is mounted on the susceptor 1, and then the atmosphere gas G is supplied to the surface of the silicon wafer W from the supply port 2*a*. In this condition, the temperature is raised to the heat treatment temperature of between 1135° C. and 1170° C., followed by heat treatment including rapid heating and quenching (for example, temperature increased by 50° C. per second, decreased by 70° C. per second), for a period of between one second and 60 seconds (for example, 10 seconds).

In the heat treatment, pure Ar is supplied at a high flow rate as the atmosphere gas prior to raising the temperature to 800° C., displacing the atmosphere gas in the heat treatment furnace, and thus purging it of oxygen. With oxygen completely removed from the furnace, the temperature is raised to 800° C. while supplying pure Ar at a predetermined flow rate.

NH$_3$ is then introduced to the heat treatment furnace at a predetermined flow rate, and the temperature raised rapidly from 800° C. to a predetermined heat treatment temperature (for example, 1150° C.) while supplying a mixture of Ar and NH$_3$ as the atmosphere gas. Moreover, heat treatment is conducted for a predetermined time while maintaining a constant heat treatment temperature, after which it is quenched to 800° C.

Then, with the heat treatment temperature maintained at 800° C., pure Ar is supplied as the atmosphere gas at an increased flow rate until the NH$_3$ is discharged completely. Then, after the NH$_3$ has been discharged completely, cooling proceeds in the pure Ar atmosphere gas. Thus, the atmosphere gas G including NH$_3$ is supplied as the atmosphere gas from a point during temperature increase, to a point during quenching and cooling.

After the heat treatment, the wafer W is quenched by removing it from the heat treatment furnace. At this time, the internal oxygen donor can be removed by heat treatment (800° C.) during the aforementioned purging, and by the effects of quenching upon removal.

The vacancy heat treatment enables nitriding of the surface of the silicon wafer W, that is, forming a nitride film or oxynitride film, at a lower heat treatment temperature in comparison with the case in which an atmosphere gas including primarily N$_2$ is used. As shown in FIG. 3A, therefore, sufficient vacancies V can be injected into the interior (near the surface in particular).

Furthermore, oxygen is precipitated by the vacancies and interstitial oxygen using the heat treatment furnace and the like, after the aforementioned vacancy heat treatment (RTA treatment). The readily dispersed interstitial silicon thus produced is agglomerated, and SF nuclei heat treatment conducted to form SF nuclei.

The heat treatment temperature at this time is set to 1100° C. or higher for approximately one hour, and the rate of temperature increase is set to 10° C./minute or less. Setting in this manner allows, as shown in FIG. 4B, SFs in SF nuclei regions wherein SF nuclei are distributed to be distributed throughout the entire in-plane direction of the silicon wafer W, even for the perfect region wherein SF nuclei do not originally occur, and setting of SF nuclei density to between 0.5×10$^8$/cm$^3$ and 1.0×10$^{11}$/cm$^3$.

Here setting the temperature of the aforementioned SF nuclei heat treatment process to below 1100° C. is undesirable since insufficient interstitial silicon is released when oxygen is precipitated using supersaturated vacancies, and it cannot be agglomerated to form SF nuclei. Moreover, maintaining the temperature of the aforementioned SF nuclei heat treatment process for a period of less than one hour is undesirable since insufficient interstitial silicon is released when oxygen is precipitated using supersaturated vacancies, and it cannot be agglomerated to form SF nuclei. Furthermore, setting the rate of temperature increase to more than 10° C./minute is undesirable since insufficient oxygen is precipitated from the vacancies, and the interstitial silicon released cannot be agglomerated to form SF nuclei.

DZ layer heat treatment (for example, heat treatment at a temperature of 800° C. for a period of four hours, immediately followed by heat treatment at 1000° C. for 16 hours) is conducted after the aforementioned vacancy heat treatment process, resulting in vacancy out-diffusion, and formation of an oxide film, on the surface layer as shown in FIG. 3B, and a consequent mutual annihilation of the injected vacancies and interstitial silicon. This in turn results in forming the DZ layer DZ. Moreover, this enables formation of an SF nuclei layer S of high SF nuclei density in the interior (near the surface in particular).

Heat treatment is not restricted solely to formation of the DZ layer, and heat treatment conducted in the subsequent device manufacturing process may also be used for DZ layer heat treatment.

Since vacancy heat treatment and SF nuclei heat treatment are conducted for the silicon wafer W in the present embodiment in this manner, SF nuclei distribution density can be set to the condition and range noted above.

That is, it is possible to form SF nuclei enabling formation of SFs of a maximum diameter of 5 μm as shown in FIG. 5B by the symbols SF, instead of BMDs of between 50 nm and 200 nm in size as shown by the black spots in the silicon wafer W shown in FIG. 5A. Thus, in comparison with BMDs as the sole gettering source, it is possible to provide a silicon wafer with a high IG effect over the entire surface of the silicon wafer W. At the same time, since a high strength may be obtained in the mid-section of the silicon wafer, sufficient strength as required for the entire silicon wafer can be obtained.

Silicon wafers cut from an ingot formed from the perfect region [P] are used in the present embodiment, however, silicon wafers from other regions can also be used.

[Second Embodiment]

A second embodiment of a silicon wafer and manufacturing method according to the present invention is explained below with reference to the drawings.

Same as the first embodiment explained above, the SF nuclei density of the silicon wafer of the present embodiment is set to between 0.5×10$^8$ cm$^{-3}$ and 1×10$^{11}$ cm$^{-3}$, and these SF nuclei are distributed throughout the entire in-plane direction of the wafer W.

Assuming that, within the silicon single-crystal ingot, a region wherein interstitial silicon-type point defects are dominant is referred to as [I], a region wherein vacancy-type point defects are dominant is referred to as [V], and a perfect region wherein interstitial silicon-type point defect agglomerates and vacancy-type point defect agglomerates are nonexistent is referred to as [P], the silicon wafer W of the present embodiment is sliced from an ingot formed from the region [V] wherein vacancy-type defects are dominant.

This ingot is pulled from the silicon melt within the hot zone with the Czochralski method, and using a pulling speed profile based on Voronkov's theory.

More specifically, the rate at which the ingot is pulled V (mm/minute), and the temperature gradient of the ingot in the vertical direction in the vicinity of the interface between the silicon melt in the crucible and the ingot G (° C./minute), are set such that the value of V/G is between 0.20 mm$^2$/° C.·minute and 0.25 mm$^2$/° C.·minute. This corresponds to the range (V/G)$_2$ to (V/G)$_3$ in FIG. 2.

The following apparatus is employed in pulling the ingot with the pulling speed profile noted above. This pulling apparatus includes a chamber being a hollow hermetically sealed container, and a shaft able to move up and down and fitted vertically in the bottom of the center of the chamber, a susceptor mounted on the shaft, a quartz (SiO$_2$) crucible to hold a silicon melt and mounted on and supported by the susceptor, a heater placed around the periphery of the crucible and separated from it at a predetermined distance, and a thermal insulation cover placed over the periphery of the heater.

Furthermore, this pulling apparatus is provided with an approximately cylindrical flow pipe located coaxial with the crucible, and a circular upper ring supporting the flow pipe fitted to the top of the thermal insulating cover, above the crucible.

The following explains the method of pulling using such a pulling apparatus.

Argon gas is initially supplied from the flow pipe, and the heater switched on to melt the silicon raw material and form a melt. The temperature near the surface at the center of the melt is then maintained at the single-crystal growth temperature.

A seed crystal suspended by a pulling wire is then wetted by lowering into the melt, and a dislocation-free crystal formed by necking. The ingot is then pulled and growth commenced while rotating the crucible and pulling wire in opposing directions. That is, following necking, the shoulder part of the ingot is grown, and a regular-shaped part is then pulled and grown. In this case, settings are such that the V/G ratio noted above is maintained.

Here, the region $(V/G)_2$ to $(V/G)_3$ shown in FIG. 2 is a region wherein neither COP nor LD occur within the wafer surface, with only SF nuclei being formed in a ring-shaped pattern at approximately half the radius of the silicon wafer W1 with the pulling speed profile for this region. This may be confirmed from the fact that OSF occurs with heat treatment of the silicon wafer W1 for between 2 and 5 hours at a temperature of 1000° C.±30° C., followed by heat treatment for between 1 and 16 hours at a temperature of 1130° C.±30° C., in an oxygen atmosphere, with the conventional heat treatment employed to expose OSFs, however as shown in FIG. 4A, the OSF ring is existent only at approximately half the radius of the silicon wafer W1.

On the other hand, with the present embodiment, the pulling speed profile for the silicon ingot used in manufacture of the silicon wafer W is set within the range noted above, the silicon ingot is pulled, and silicon wafers cut from the silicon ingot. As a result, in addition to setting the SF nuclei density to between $0.5 \times 10^8$ cm$^{-3}$ and $1 \times 10^{11}$ cm$^{-3}$, the SF nuclei can be distributed throughout the entire in-plane direction of the silicon wafer, as shown in FIG. 4B. Consequently, as same as the first embodiment, in comparison with BMDs, it is possible to provide a silicon wafer W with a high IG effect over the entire surface of the silicon wafer W.

[Third Embodiment]

A third embodiment of a silicon wafer and manufacturing method related to the present invention is explained below with reference to the drawings.

As with the first embodiment explained above, the SF nuclei density of the silicon wafer of the present embodiment is set to between $0.5 \times 10^8$ cm$^{-2}$ and $1 \times 10^{11}$ cm$^{-2}$, and these SF nuclei are distributed throughout the entire in-plane direction of the wafer.

In the present invention, cutting of silicon wafers from ingots having an internal nitrogen concentration of between $5 \times 10^{14}$ cm$^{-3}$ and $5 \times 10^{15}$ cm$^{-3}$ enables SF nuclei distribution and density to be set as noted above.

In practice, in the pulling apparatus employed in pulling the ingot in the second embodiment explained above, silicon nitride ($Si_3N_4$) is introduced as an impurity (dopant) to the silicon raw material in the crucible, and nitrogen gas ($N_2$) is blown onto the melt to ensure that the ingot is pulled in a nitrogen atmosphere. As a result, nitrogen is added (doped) as the impurity, and the concentration of nitrogen in the ingot is set as noted above.

To avoid metal contamination, it is desirable to form a $Si_3N_4$ film of approximately 1 mm in thickness on a 200 mm diameter silicon wafer using semiconductor-grade material gas formed on a high-purity silicon wafer.

In this manner, in the present embodiment, the ingot is doped during pulling, and silicon wafers are cut from the ingot. As a result, in addition to setting the SF nuclei density to between $0.5 \times 10^8$ cm$^{-3}$ and $1 \times 10^{11}$ cm$^{-3}$, the SF nuclei can be distributed throughout the entire in-plane direction of the silicon wafer, as shown in FIG. 4B. Consequently, as same as the first and second embodiments explained above, in comparison with BMDs, it is possible to provide silicon wafers with a high IG effect over the entire surface of the silicon wafer.

In the aforementioned various embodiments, it is possible to manufacture a silicon wafer W with a combination of two or three of; vacancy heat treatment+SF nuclei heat treatment, pulling speed profile, and nitrogen doping.

Furthermore, in the various embodiments, heat treatment for formation of the DZ layer is possible as in the first embodiment explained above.

What is claimed is:

1. A method for manufacturing a silicon wafer, comprising:

removing an oxide film on a surface of a silicon wafer;

after removing, vacancy heat treating for forming new vacancies in an interior of said silicon wafer by means of a heat treatment of said silicon wafer at a temperature of 1135 to 1170° C. in an atmosphere containing $NH_3$ for a period of between one second and 60 seconds so as to nitride the surface of said silicon wafer;

quenching said silicon wafer after said vacancy heat treating; and

SF nuclei heat treating for agglomerates interstitial silicon released during precipitation of oxygen from vacancies injected by said vacancy treating, to form stacking fault nuclei, thereby forming an SF nuclei layer of high stacking fault nuclei density in the interior near the surface, wherein during said vacancy heat treating, purging is conducted to remove oxygen from said atmosphere surrounding said silicon wafer, and in said SF nuclei heat treating, a rate of temperature increase is set to 10° C./minute or less, a heat treatment temperature is set to 1100° C. or higher, and said heat treatment temperature is maintained for one hour or more.

2. A method for manufacturing a silicon wafer according to claim 1, further comprising heat treating said silicon wafer to form at least a defect-free layer in the surface of said silicon wafer.

3. A silicon wafer manufactured by said method of claim 2 and comprises:

a DZ layer in the surface thereof; and an SF nuclei layer of high stacking fault nuclei density in the interior near the surface, wherein stacking fault nuclei which are formed from agglomeration of interstitial silicon are distributed throughout an entire in-plane direction of said SF nuclei layer, and a density of said stacking fault nuclei is set in a range of between $0.5 \times 10^8$ cm$^{-3}$ and $1 \times 10^{11}$ cm$^{-3}$.

4. A method for manufacturing a silicon wafer according to claim 1, wherein the method further comprises pulling an ingot from a silicon melt in a crucible in accordance with the Czochralski method, and slicing said ingot to manufacture said silicon wafer, and said ingot is pulled such that a ratio V/G of, a rate V at which said ingot is pulled, and a temperature gradient G of said ingot in a vertical direction in a vicinity of an interface between said silicon melt in said crucible and said ingot, is between 0.20 mm$^2$/° C.·minute and 0.25 mm$^2$/° C.·minute.

5. A method for manufacturing a silicon wafer according to claim 1, wherein the method further comprises pulling an ingot from a silicon melt in a crucible in accordance with the Czochralski method, and slicing said ingot to manufacture a silicon wafer, and nitrogen is added while pulling said ingot, to set an internal nitrogen concentration within a range of between 5×10$^{14}$ cm$^{-3}$ and 5×10$^{15}$ cm$^{-3}$.

6. A method for manufacturing a silicon wafer according to claim 1, wherein in said SF nuclei heat treating, while interstitial silicon is injected in a surface of said silicon wafer, said stacking fault nuclei are formed.

7. A method for manufacturing a silicon wafer according to claim 1, wherein in said SF nuclei heat treating, said stacking fault nuclei are formed from only said interstitial silicon released during precipitation of oxygen.

8. A method for manufacturing a silicon wafer according to claim 1, wherein said silicon wafer is subjected to said SF nuclei heat treating in a state in which a high concentration of vacancies are formed in the interior near the surface.

9. A silicon wafer, which is manufactured by the method for manufacturing a silicon wafer of claim 1, and comprises an SF nuclei layer of high stacking fault nuclei density in the interior near the surface, wherein stacking fault nuclei which are formed from agglomeration of interstitial silicon are distributed throughout an entire in-plane direction of said silicon wafer, and a density of said stacking fault nuclei is set in a range of between 0.5×10$^8$ cm$^{-3}$ and 1×10$^{11}$ cm$^{-3}$.

10. A silicon wafer according to claim 9, which is cut from an ingot formed from a perfect region in which interstitial silicon-type point defect agglomerates and vacancy-type point defect agglomerates are substantially non-existent.

11. A silicon wafer according to claim 9, which is cut from an ingot formed from a region in which vacancy-type point defects are dominant.

* * * * *